United States Patent

Breunsbach

[11] Patent Number: 5,534,078
[45] Date of Patent: Jul. 9, 1996

[54] METHOD FOR CLEANING ELECTRONIC ASSEMBLIES

[76] Inventor: Rex Breunsbach, 14732 SE. 117th Ave., Clackamas, Oreg. 97015

[21] Appl. No.: 189,508

[22] Filed: Jan. 27, 1994

[51] Int. Cl.$^6$ .................................................. B08B 3/00
[52] U.S. Cl. ........................... 134/10; 134/26; 134/22.14; 134/22.19; 134/36; 134/40; 134/95.3
[58] Field of Search ............................. 134/10, 26, 22.14, 134/22.19, 27, 28, 29, 40, 95.3, 36; 210/540

[56] References Cited

U.S. PATENT DOCUMENTS

| | | | |
|---|---|---|---|
| 3,489,608 | 1/1970 | Jacobs et al. | 134/25 |
| 3,871,914 | 3/1975 | Goffredo et al. | 134/109 |
| 3,880,685 | 4/1975 | Rehm et al. | 156/19 |
| 3,904,430 | 9/1975 | Tipping et al. | 134/26 X |
| 3,923,541 | 12/1975 | Healy | 134/31 |
| 3,964,956 | 6/1976 | Snyder | 156/345 |
| 3,973,572 | 8/1976 | Brous | 134/57 R |
| 4,132,567 | 1/1979 | Blackwood | 134/1 |
| 4,178,188 | 12/1979 | Dussault et al. | 134/1 |
| 4,299,665 | 11/1981 | Clay et al. | 202/204 |
| 4,409,999 | 10/1983 | Pedziwiatr | 134/95 |
| 4,589,926 | 5/1986 | Holmstrand | 134/6 |
| 4,635,666 | 1/1987 | Daley et al. | 134/172 |
| 4,640,719 | 2/1987 | Hayes et al. | 134/40 |
| 4,643,774 | 2/1987 | Kishida et al. | 134/1 |
| 4,682,615 | 7/1987 | Burkman et al. | 134/102 |
| 4,731,154 | 3/1988 | Hausman Hazlitt et al. | 156/626 |
| 4,740,247 | 4/1988 | Hayes et al | 134/42 |
| 4,740,249 | 4/1988 | McConnell | 134/25.4 |
| 4,749,440 | 6/1988 | Blackwood et al. | 156/646 |
| 4,778,532 | 10/1988 | McConnell et al. | 134/10 |
| 4,784,169 | 11/1988 | Stiedieck | 134/111 |
| 4,827,867 | 5/1989 | Takei et al. | 118/64 |
| 4,852,516 | 8/1989 | Rubin et al. | 118/715 |
| 4,871,417 | 10/1989 | Nishizawa et al. | 134/33 X |
| 4,902,350 | 2/1990 | Steck | 134/1 |
| 4,977,688 | 12/1990 | Roberson, Jr. et al. | 34/92 |
| 4,980,300 | 12/1990 | Miyashita et al. | 437/10 |
| 4,984,597 | 1/1991 | McConnell et al. | 134/95 |
| 5,022,419 | 6/1991 | Thompson et al. | 134/102 |
| 5,027,841 | 7/1991 | Breunsbach et al. | 134/95 |
| 5,055,138 | 10/1991 | Slinn | 134/11 |
| 5,201,958 | 4/1993 | Breunsbach et al. | 134/1 |
| 5,246,023 | 9/1993 | Breunsbach et al. | 134/57 R |
| 5,271,773 | 12/1993 | Hamilton et al. | 134/10 |
| 5,340,407 | 8/1994 | Bolden et al. | 134/26 |

Primary Examiner—David L. Lacey
Assistant Examiner—Sean Vincent
Attorney, Agent, or Firm—Klarkquist Sparkman Campbell Leigh & Whinston

[57] ABSTRACT

The concentration of solvent in a fluid including solvent and aqueous components is gradually decreased while the fluid is in contact with the electronic assemblies to be cleaned. An apparatus for cleaning electronic assemblies has a fluid supply tank containing emulsifiable fluids and a wash chamber containing the electronic assemblies. A fluid circuit includes a supply pump and a supply line for providing fluid from the tank to the chamber, and a valve drain line for returning fluid to the chamber to the pump. A sprayer within the chamber uses a separate sprayer pump for spraying fluid collected within the chamber onto the assemblies. The supply pump is connected to the supply tank at an intermediate level such that it initially draws off all of the uppermost, lightest fluid layer, and only a portion of the lower fluid. Consequently, the initial wash includes a higher solvent concentration than in later wash stages, when all fluid is uniformly mixed.

23 Claims, 2 Drawing Sheets

METHOD FOR CLEANING ELECTRONIC ASSEMBLIES

FIELD OF THE INVENTION

This invention relates to a method and apparatus for cleaning printed circuit boards and other electronic assemblies. More particularly, the invention relates to a cleaning system that employs an emulsion of solvent and aqueous solution.

BACKGROUND AND SUMMARY OF THE INVENTION

During assembly of components on printed circuit boards, soldering fluxes are applied to the board material to facilitate soldering. After soldering, remaining flux residue must be removed. The flux chemistry determines what fluid is suitable for removing the flux. Unlike some fluxes, rosin-based fluxes are not removable with a water wash, and require more aggressive solvents that have environmental disadvantages. Such solvents may generate flammable and environmentally undesirable vapors that must be safely contained, and may also require costly disposal methods because they cannot be drained into conventional sewer systems.

Cleaning systems employing an emulsion of solvent and aqueous solution have been employed to reduce environmental and safety concerns. A typical emulsion includes a solvent that is immiscible with the aqueous solution. Therefore, when sprayed on parts being cleaned, the solvent droplets and aqueous droplets each independently contact and dissolve different contaminants, providing effective cleaning. Existing systems are believed to employ emulsions that consist of 10 or 20 percent solvent, with the remainder being water or another aqueous solution.

In existing systems, the emulsion fluid is pumped from a single chamber, which is entirely drained into a wash chamber. The fluid is sprayed within the wash chamber to clean parts contained therein. Thus, the proportion of solvent in the emulsion mixture does not appreciably vary during the wash cycle. Any wash fluid remaining on the parts has the same solvent concentration as it initially did.

In general, increased solvent concentration provides more effective cleaning, but carries with it increased operational costs and environmental, health and safety concerns.

The primary objects of the invention are to provide:

1. A cleaning apparatus and method for effectively cleaning electronic assemblies.

2. A cleaning apparatus and method that conserves solvent and minimizes the generation of waste water, reducing costs and environmental impact.

3. A cleaning apparatus and method that is safe to operate and which avoids fire, explosion, and health hazards.

According to the present invention, the primary objects are achieved by providing a cleaning apparatus having a supply tank containing an aqueous fluid, with a supply pump connected to draw fluid from an intermediate level in the supply tank. The supply pump directs the fluid to a wash chamber containing a spray pump for spraying the fluid through a spray assembly onto parts to be cleaned. A valved drain line provides selectable drainage from the wash chamber to the supply tank.

According to the method of the present invention, the primary objects are achieved by operating the supply pump to draw a first portion of fluid from the supply tank, the first portion being from a level at or above the supply pump intake. This first portion includes all of the solvent and a limited quantity of the aqueous solution. The first portion of the fluid is then sprayed within the chamber onto the assemblies. To reduce the solvent concentration, the drain line valve is opened to permit some of the fluid to return to the supply tank. As fluid returns to the supply tank, it partially mixes with the aqueous fluid remaining in the supply tank. The supply pump continuously draws fluid from the tank to replace the drained amount. Initially, this replacement fluid has a significantly lower solvent concentration than the fluid that resides in the wash chamber. Accordingly, the solvent concentration in the wash chamber diminishes until the wash fluid in the wash chamber and supply tank is thoroughly mixed, and approaches a common solvent concentration. Thereafter, the wash fluid is drained from the wash chamber, and the parts may be rinsed by water.

Because the final solvent concentration of the wash fluid is substantially lower than the initial concentration, the rinse process is more effective, requires less water, and generates less waste. Nonetheless, the initial solvent concentration during the wash cycle is sufficiently high to provide effective cleaning that might not otherwise be possible at the concluding solvent concentration.

The foregoing and additional features and advantages of the present invention will be more readily apparent from the following detailed description that proceeds with reference to the accompanying drawings.

DETAILED DESCRIPTION OF A PREFERRED EMBODIMENT

Figure 1:
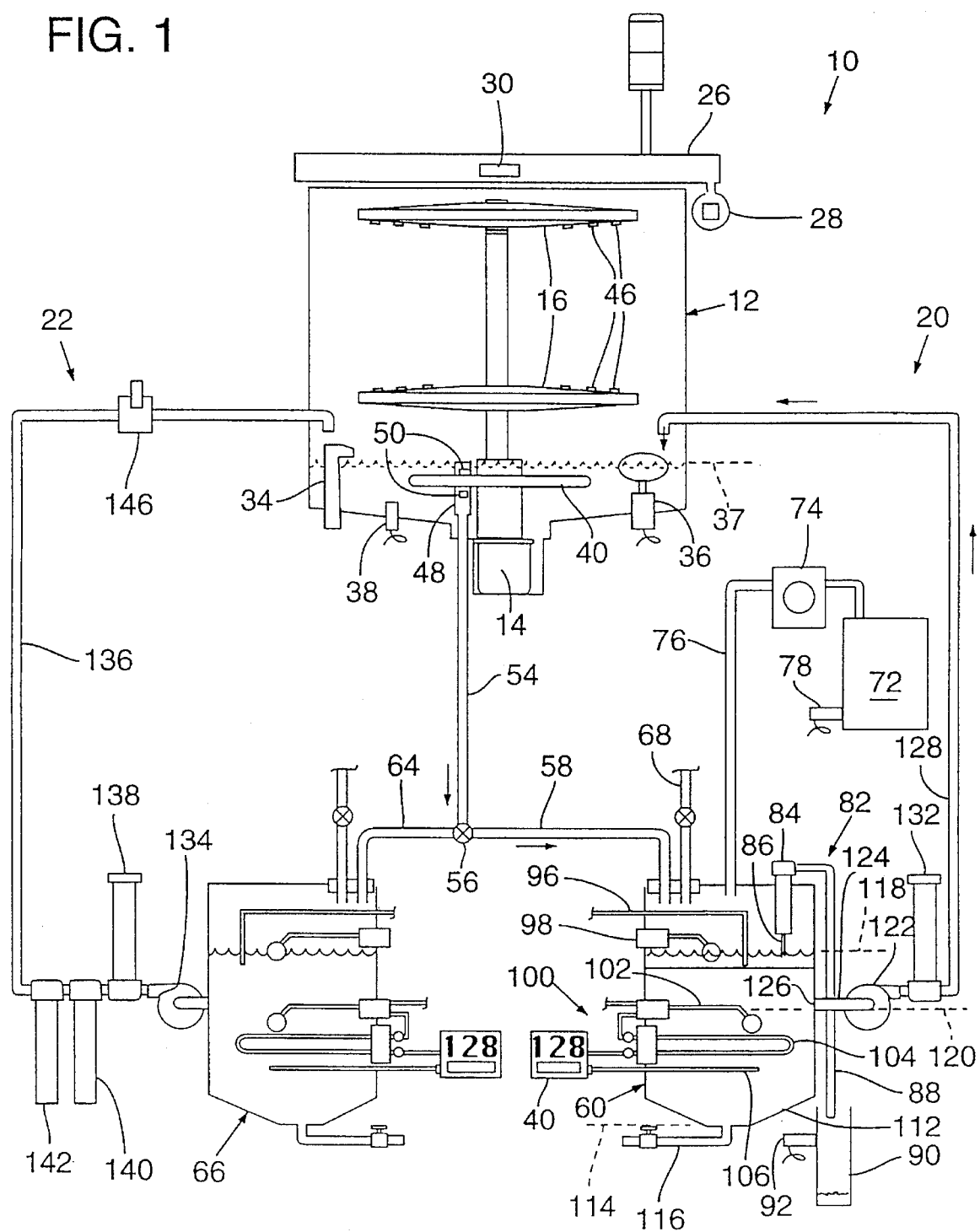
FIG. 1 is a schematic side view of a cleaning apparatus according to the present invention.

FIG. 1 shows a wash system 10 including a wash chamber 12 for containing printed circuit boards or other electronic assemblies on racks (not shown) for washing. The wash chamber 12 includes a sprayer pump 14 and sprayer arms 16, with the pump being connected to draw fluid from the base of the chamber and direct the fluid via the sprayer arms 16 onto the assemblies being washed.

The system includes a wash circuit 20 and a rinse circuit 22, with each circuit being in fluid communication with the chamber in the form of a loop leading out of the chamber and returning into the chamber. As will be discussed below, each circuit includes a fluid supply tank and a separate pump for providing fluid to the wash chamber and for accepting drainage from the chamber.

The wash chamber 12 may be opened in the manner of a conventional dishwasher to permit insertion and removal of parts to be cleaned. An exhaust plenum 26 having an associated plenum flow switch 28 is positioned adjacent the door opening to draw in any escaping gases when the door is open. A second exhaust plenum may also be provided below the door for additional ventilation. A door interlock switch 30 is connected to a controller (not shown) to provide a signal when the door is open, such that the controller activates the plenum flow switch to draw gases into the exhaust plenum when the door is open.

Within the wash chamber, an air inlet 34 permits air to be vented through the chamber for drying of workpieces. Fluid in the chamber is limited to a normal full level 37, which is normally determined by the amount of fluid supplied to the chamber, and need not be otherwise limited.

A sump temperature and conductivity probe 38 is attached within a lower portion of the wash chamber 12, and sends to the controller information regarding the temperature and electrical conductivity of fluid within the chamber. The spray pump 14 is positioned to take in fluid from a lowest level within the chamber and to propel it at a high-volume flow rate, preferably about 60 gallons per minute. Fluid is propelled through the sprayer arms 16, which include nozzles 46 that are sufficiently large to permit such a flow rate with a limited back pressure of about one foot of water.

Normal drainage from the wash chamber 12 is provided by a drain tower 48 that protrudes upwardly from the bottom of the wash chamber. The drain tower is a vertical, upwardly open cylinder, with an upper aperture permitting large drainage flow when the fluid level rises above the level of aperture. In addition, a number of side apertures 50 are defined in the side of the drain tower to provide limited drainage flow from different levels within the fluid in the chamber. The lower of the said apertures 50 are generally smaller than the upper apertures. This intermediate level drainage avoids "skimming" the lightest fluid components off the surface of fluid remaining in the chamber. The net effect is to provide a low drainage flow when the fluid level is well below the full level 37, a moderate drainage flow when the fluid level is moderately below the full level, and a rapid drain rate when the fluid level rises above the full level.

The drain tower 48 communicates with both the wash circuit 20 and rinse circuit 22. Specifically, the drain tower empties downwardly into a drain line 54, which terminates at a drain valve 56. A first drain line branch 58 provides fluid flow between the drain valve 56 and a wash fluid supply tank 60. A second drain line branch 64 similarly communicates with a rinse fluid supply tank 66, the supply tanks being separate from each other. The drain valve 56 is actuated by the controller between (1) a closed state, in which fluid cannot flow from the drain line 54 to either branch 58 or 64, (2) a drain-to-wash state in which fluid may drain only to the wash fluid supply tank 60, and (3) a drain-to-rinse state in which fluid may drain only to the rinse fluid supply tank 66.

The wash fluid supply tank 60 includes a valved filling line 68 for adding fluid such as water to the tank. Solvent may be supplied from a solvent supply container 72 by a metering pump 74 through a solvent supply line 76. A solvent supply level sensor 78 is connected to the controller and positioned within the container 72 to indicate when the solvent supply requires replenishment. A solvent recovery system 82 includes a rotating-disk skimmer 84 having a disk 86 extending just below a full level 122 in the wash fluid supply tank 60. An outlet tube 88 drains into a waste tank 90, with a fluid level sensor 92 connected to the controller to indicate when the waste tank requires emptying. A temperature sensor 96 extends downwardly into the fluid within the tank 60 when the tank is full. A float switch 98 is positioned within the tank to signal the controller when fluid in the tank has reached a predetermined level, thereby initiating shut-down of tank-filling operations. A heating system 100 includes a safety float switch 102, a heating element 104, and a temperature sensor 106 immersed within the tank. A temperature controller 110 in the heating system 100 maintains the fluid temperature within a preselected range; the safety float switch 102 prevents heater operation when the fluid level has excessively dropped, to avoid exposure of an active heating element.

The wash fluid supply tank 60 is preferably shaped as a vertical cylinder having a conical base 112 terminating at a lowest level 114. A valved service drain line 116 extends from the lowest portion of the tank to provide complete draining of the tank and removal of sediments and contaminants collected therein. A fluid full level 118 is defined just above the lower edge of the solvent recovery disk 86 and temperature sensor 96, and is the level at which the fluid will activate the float switch 98 to prevent additional fluid from flowing into the tank. An intermediate fluid level 120 is indicated well below the full level 118 and well above the lowest level 114. In the preferred embodiment, the volume within the tank below the intermediate level 120 is about three times the volume within the tank between the intermediate level and the full level 118. The intermediate level should be above the heater safety float switch 102 so that the float switch is maintained in a floating position to permit heater operation when the fluid level within the tank is at or above the intermediate level 120.

A wash fluid supply pump 122 is connected at its intake to a conduit 124. The conduit 124 opens into the wash fluid supply tank 60 at an aperture 126 positioned so that the lower edge of the aperture 126 is at the intermediate level 120. Consequently, the pump 122 will be unable to reduce the fluid level in the tank below the intermediate level 120, and will operate in a "pump-starved" mode to draw off any fluid above the intermediate level as it becomes available. The pump 122 directs its fluid output through an output conduit 128 that terminates within the wash chamber 12, and which includes an in-line particulate filter 132 that facilitates mixing or emulsifying of fluid components as they pass therethrough.

The rinse tank 66 includes a valved fill line, a temperature sensor, a float switch, a heating system, and a tank drain essentially the same as those described with respect to the wash fluid supply tank 60. A rinse fluid pump 134 drives the fluid through a rinse conduit 136, which includes an in-line particulate filter 138, a carbon filter 140, and a deionizing filter 142. A conductivity probe 146 is included in-line in the rinse conduit 136 downstream from the filters 138, 140 and 142. The conductivity probe 146 serves to detect contamination of the rinse fluid by solvent used during the wash process. When contamination reaches a predetermined level, the probe sends a signal to the controller to alert an operator to the need to recondition or replace the rinse fluid. Because the filters contained in the rinse circuit are generally effective in removing solvent from the rinse fluid, a signal from the conductivity probe that rinse fluid is depleted may also indicate the need to inspect and replace at least some of the filters.

In the preferred embodiment, the wash fluid includes 5 percent solvent, preferably a water-immiscible terpene or a hydrocarbon blend solvent. The remainder of the wash fluid preferably consists of deionized water. In the preferred embodiment, the solvent and the aqueous components of the wash fluid are immiscible, such that they do not permanently mix as a result of vigorous agitation, and return to separate layers when allowed to settle for a time. The rinse fluid is preferably deionized water.

The supply pumps preferably operate at a rate of one to two gallons per minute. Consequently, the 60-gallon-per-minute spray rate in the wash chamber is significantly greater than the supply flow rate. The supply flow rate in alternative embodiments may range between one and five gallons per minute, and the spray flow rate may range between 40 and 80 gallons per minute. Best results are obtained when the spray flow rate is between 10 and 100 times greater than the supply flow rate.

OPERATION

FIGS. 2A through 2G illustrate the preferred sequence of operations. In these schematic views, a solvent concentration meter 150 is depicted to illustrate the percentage concentration of solvent within the wash chamber 12, as detected by a concentration sensor 152 mounted in a lower portion of the chamber. In fact, the preferred embodiment does not include such a meter and sensor; these are shown merely to illustrate the sequence of operations.

Figure 2A:
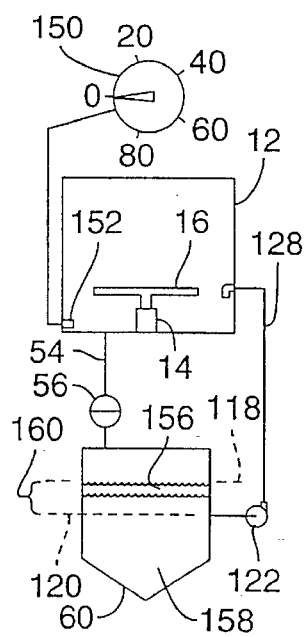
FIGS. 2A, 2B, 2C, 2D, 2E, 2F, and 2G are simplified schematic side views of the apparatus of FIG. 1, illustrating a method of operation according to the present invention.

In FIG. 2A, the tank 60 contains a layer of solvent 156 that rests atop a quantity of aqueous solution 158. A first portion 160 of the fluid within the tank 60 includes all fluid above the intermediate level 120. This accounts for about one quarter of the fluid volume within the tank. The solvent 156 accounts for about one fifth of the volume of the first fluid portion 160 (and therefore 5% of the total wash fluid volume). The concentration meter 150 indicates zero because no fluid, and therefore no solvent, resides in the wash chamber 12.

Figure 2B:
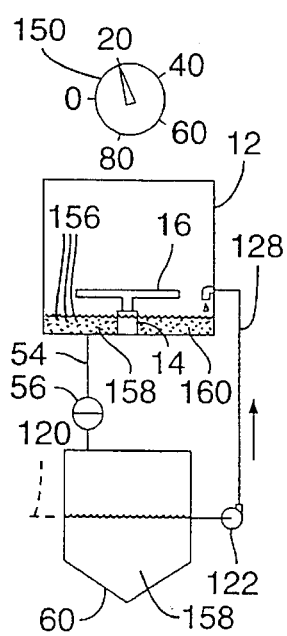

In FIG. 2B, the first portion of fluid 160 has been pumped into the chamber 12 so that the remaining fluid in the tank 60 is at or below the intermediate level 120. By the action of pumping, and by passing through the particulate filter 132 shown in FIG. 1, the first portion of fluid may be somewhat mixed so that the solvent 156 may become suspended as droplets within the aqueous solution 158. At this stage, all solvent is within the chamber, providing the highest possible solvent concentration of 20% as indicated on the meter 150.

Figure 2C:
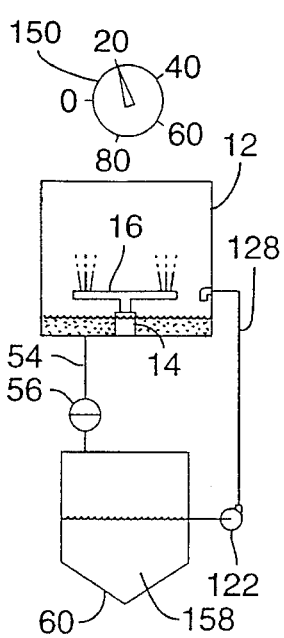

As shown in FIG. 2C, the spray pump 14 may be activated to continually spray the first portion of fluid 160 through the sprayer arm 16 within chamber 12. This may continue for a predetermined time while the drain valve 56 remains closed, and while pump 122 is inactive. The spraying action thoroughly mixes the solvent and aqueous solution to provide an emulsion that does not separate out while spraying continues.

Figure 2D:
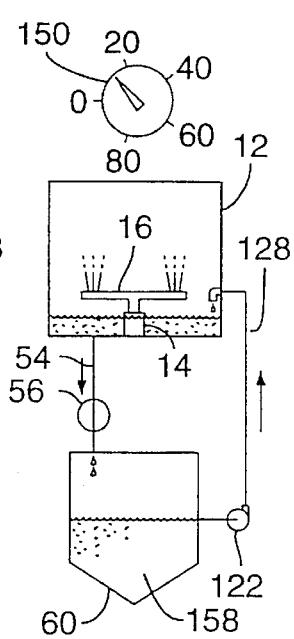
Figure 2E:
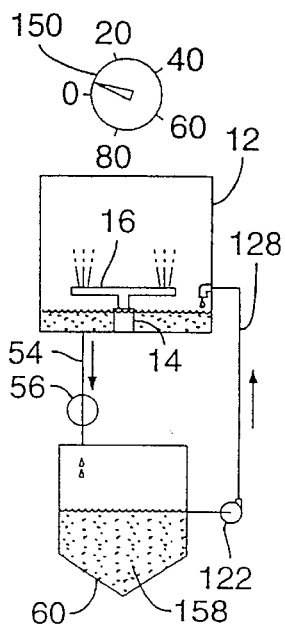
Figure 2F:
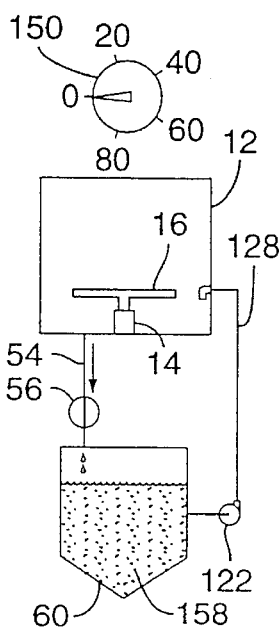

As shown in FIG. 2D, spraying continues while the drain valve 56 is opened to permit fluid to drain from the wash chamber 12 to the tank 60. The pump 122 is reactivated by rising tank fluid level to draw fluid from the supply tank at a rate generally equal to the rate at which fluid drains into the tank. Because the fluid remaining in the tank has little or no solvent compared to the mixture in the wash chamber, the draining of washing chamber fluid and pumping of supply tank fluid causes the solvent concentration in the wash chamber to decrease. This rate of decrease is greatest initially, when the fluid in the supply tank contains no solvent. As circulation continues by draining and pumping, the decrease in wash chamber concentration becomes more gradual. Eventually, as shown in FIG. 2E, the concentration in the wash chamber approaches a minimum level, in this case 5% solvent. With prolonged spraying and circulation, this concentration is evenly distributed throughout the system, and corresponds to the initial 5-to-95 solvent-to-aqueous concentration in the supply tank.

When adequate cleaning has occurred, operation of the pumps 122 and 14 is halted, and drain valve 56 is kept open to permit all fluid to drain from the wash chamber 12 to the supply tank 60. Any fluid droplets remaining in the chamber will have an average solvent concentration of about 5%.

Figure 2G:
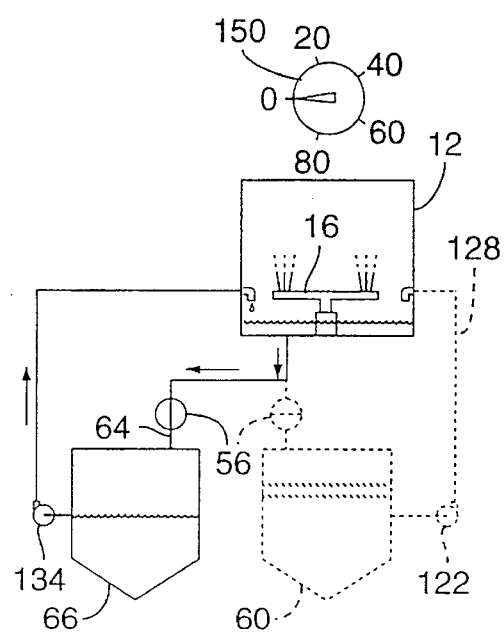

As shown in FIG. 2G, the rinse cycle commences after the wash cycle is complete. Valve 56 (shown here as separate valves, but actually a single valve in the preferred embodiment) is positioned to permit flow from the wash chamber 12 to the rinse tank 66, and to prevent flow to the wash tank 60. Both the rinse pump 134 and spray pump 14 are operated to circulate the rinse fluid and spray it onto the assemblies. During the rinse cycle, fluid in the wash tank 60 settles out into a layered arrangement, permitting the wash cycle to begin again as shown in FIG. 2A.

Because of the low solvent concentration in any wash fluid droplets remaining in the wash chamber after the draining step, the rinse process is highly efficient. In this case, rinsing is twenty times as efficient, substantially reducing the amount of time and water to achieve a suitably effective rinse. Instead of removing a substantial quantity of solvent with the rinse fluid, most solvent returns to the wash tank where it may be effectively re-used in future wash cycles. The increased rinse efficiency provided by the disclosed apparatus and method also permits a more thorough rinse than would ordinarily be possible, reducing the amount of residual solvent that is "dragged through" by remaining on parts and racks that are removed from the apparatus after cleaning. Reduction of solvent "dragged through" reduces environmental concerns associated with the evaporation of volatile solvents into the atmosphere, and further helps reduce safety hazards associated with the flammability and inhalation of such solvents. The safety and environmental concerns are inherently at a low level because of the limited solvent concentrations used, even during the initial wash phase illustrated in FIG. 2C, and are further reduced by the concentration reduction that occurs during the wash process.

Having illustrated and described the principles of the invention by what is presently a preferred embodiment, it should be apparent to those skilled in the art that the illustrated embodiment may be modified without departing from such principles. For instance, the flow rates and fluid concentration ratios may be varied, and alternative fluids may be substituted for those discussed. Also, the step illustrated at FIG. 2C may be eliminated so that the circulating pump 122 continues operation as spraying begins and continues. In this embodiment, the fluid concentration would immediately begin diminishing, instead of proceeding for a time at the initial concentration. The invention is claimed not only as the illustrated embodiments, but all such modifications, variations and equivalents thereof which come within the true spirit and scope of the following claims.

What is claimed is:

1. A method of cleaning electronic assemblies positioned within a wash chamber with a fluid having an aqueous component and an immiscible solvent component drawn from a supply tank, the method comprising the steps:

transferring a fluid having a high solvent concentration from the supply tank to the wash chamber;

contacting the assemblies in the wash chamber with the fluid while gradually decreasing the solvent concentration of the fluid by gradually adding additional aqueous component to the fluid.

2. A method of cleaning electronic assemblies positioned within a wash chamber with a fluid having an aqueous component and an immiscible solvent component drawn from a supply tank, the method comprising the steps:

transferring a fluid having a high solvent concentration from the supply tank to the wash chamber;

contacting the assemblies in the wash chamber with the fluid while gradually decreasing the solvent concentration of the fluid wherein said decreasing of the solvent concentration of the fluid in the wash chamber is carried out by transferring additional fluid having a relatively low solvent concentration from the supply tank to the wash chamber and mixing the additional fluid with the fluid in the wash chamber.

3. The method of claim 2 wherein the contacting is accomplished by spraying the fluid onto the assemblies in the wash chamber.

4. The method of claim 2, wherein the volume of fluid in the wash chamber is maintained substantially constant by transferring some of the fluid from the wash chamber to the supply tank as the additional fluid is transferred from the supply tank to the wash chamber.

5. The method of claim 4, wherein the fluid transferred from the wash chamber to the supply tank has a relatively high solvent concentration and is mixed with the fluid in the supply tank having a relatively low solvent concentration to gradually increase the solvent concentration of the fluid in the supply tank.

6. The method of claim 1, wherein the contacting is accomplished by spraying the fluid onto the assemblies.

7. The method of claim 6 wherein the spraying of the assemblies in the wash chamber is continuous from a first contact of the assemblies with the fluid of high solvent concentration to a final contact of the assemblies with a fluid of low solvent concentration.

8. A method of cleaning electronic assemblies positioned within a wash chamber with a fluid having an aqueous component and a solvent component drawn from a supply tank, the method comprising the steps:
   transferring a fluid having a high solvent concentration from the supply tank to the wash chamber;
   contacting the assemblies in the wash chamber with the fluid while gradually decreasing the solvent concentration of the fluid; and
   maintaining the assemblies substantially stationary during the contacting.

9. The method of claim 8, further comprising the steps of:
   rinsing the assemblies after the contacting step; and
   maintaining the assemblies substantially stationary in the wash chamber during the rinsing.

10. The method of claim 1, wherein the gradual decrease of the solvent concentration continuously slows from an initially relatively steep rate of decrease in the solvent concentration to a relatively flat rate of decrease in the solvent concentration.

11. A method of cleaning electronic assemblies positioned within a wash chamber that is connected to a supply tank with a fluid having an aqueous component and an immiscible solvent component, the method comprising the steps:
   providing a fluid having a high solvent concentration in the wash chamber;
   providing a fluid having a low solvent concentration in the supply tank;
   circulating the fluid in the wash chamber and the supply tank between the wash chamber and the supply tank to mix the fluid and gradually lower the solvent concentration in the fluid in the wash chamber; and
   spraying the fluid in the wash chamber onto the assemblies while the fluids are being circulated.

12. The method of claim 11, wherein the circulating step includes mixing the fluids to provide a gradually increasing solvent concentration in the supply tank.

13. The method of claim 12, wherein the solvent concentrations of the fluid in the wash chamber and the supply tank become substantially equal.

14. The method of claim 11, wherein the circulation of the fluids includes filtering the fluids being circulated.

15. The method according to claim 11, wherein the step of spraying the fluid in the wash chamber includes creating an emulsion of the solvent component and the aqueous component.

16. The method according to claim 11, wherein the circulation of the fluids includes the draining of the fluid from the wash chamber into the supply tank.

17. The method according to claim 11, wherein the step of providing the fluid with the high solvent concentration in the wash chamber includes transferring the fluid with the high solvent concentration from the supply tank to the wash chamber.

18. The method according to claim 17, wherein the transfer of the fluid having the high solvent concentration includes:
   disposing the solvent component to rest atop the aqueous component in the supply tank by selecting the solvent component to have a relatively low mass density and selecting the aqueous component to have a relatively high mass density; and
   pumping the fluid having the high solvent concentration from an upper level of fluid in the supply tank to the wash chamber.

19. The method according to claim 11, wherein the fluid circulated from the wash chamber to the supply tank has an initially high, declining solvent concentration, and the fluid circulated from the supply tank to the wash chamber has an initially low, increasing solvent concentration.

20. The method according to claim 11, further comprising the steps of:
   spray rinsing the assemblies in the wash chamber; and
   maintaining the assemblies substantially stationary within the wash chamber during the spraying and spray rinsing steps.

21. The method of claim 11, further comprising the step of stopping the circulation of the fluids between the wash chamber and the supply tank while continuing spraying the fluid in the wash chamber onto the assemblies.

22. A method of cleaning electronic assemblies positioned within a wash chamber that is connected to a supply tank with a fluid having an aqueous component and an immiscible solvent component, the method comprising the steps:
   positioning the electronic assemblies in the wash chamber;
   configuring the supply tank with a fluid transfer outlet at a selected level within the supply tank;
   selecting the solvent component to have a relatively low mass density so that it all resides above the fluid transfer outlet in the supply tank;
   selecting the aqueous component to have a relatively high mass density so that it resides in the supply tank from a level below the fluid transfer outlet in the supply tank to a level above the fluid transfer outlet and below the solvent component; and
   transferring all fluid positioned above the fluid transfer outlet from the supply tank through the fluid transfer outlet to the wash chamber so that the fluid in the wash chamber contains a mixture of the solvent component and the aqueous component with a high concentration of the solvent component, and the fluid remaining in the supply tank contains substantially no solvent component.

23. A method of cleaning electronic assemblies positioned within a wash chamber that is connected to a supply tank with a fluid having an aqueous component and an immiscible solvent component, the method comprising the steps:

configuring the supply tank with a fluid transfer outlet at a selected level within the supply tank;

selecting the solvent component to have a relatively low mass density so that it all resides above the fluid transfer outlet in the supply tank;

selecting the aqueous component to have a relatively high mass density so that it resides in the supply tank from a level below the fluid transfer outlet in the supply tank to a level above the outlet at the lower level of the solvent component;

transferring all fluid positioned above the fluid transfer outlet from the supply tank to the wash chamber so that the fluid in the wash chamber contains a high concentration of solvent component, and the fluid remaining in the supply tank contains substantially no solvent component;

spraying the fluid in the wash chamber onto the assemblies;

transferring the fluid from the wash chamber back to the supply tank while transferring additional fluid from the supply tank to the wash chamber through the fluid transfer outlet while continuing to spray the fluid in the wash chamber onto the assemblies, such that the solvent concentration of the fluid sprayed onto the assemblies gradually diminishes.

* * * * *